United States Patent [19]

Ipri et al.

[11] Patent Number: 4,608,591
[45] Date of Patent: Aug. 26, 1986

[54] ELECTRICALLY ALTERABLE PROGRAMMABLE NONVOLATILE FLOATING GATE MEMORY DEVICE

[75] Inventors: Alfred C. Ipri, Princeton; Roger G. Stewart, Neshanic Station, both of N.J.

[73] Assignee: RCA Corporation, Princeton, N.J.

[21] Appl. No.: 523,921

[22] Filed: Aug. 17, 1983

[51] Int. Cl.⁴ .................. H01L 29/34; G11C 11/34
[52] U.S. Cl. ............................. 357/54; 357/23.5; 365/185
[58] Field of Search ............ 357/54, 23.5, 59; 365/184, 185

[56] References Cited

U.S. PATENT DOCUMENTS

| | | | |
|---|---|---|---|
| 3,500,142 | 3/1970 | Kahng | 317/235 |
| 4,099,196 | 7/1978 | Simko | 357/23.5 |
| 4,242,737 | 12/1980 | Bate | 365/184 |
| 4,314,265 | 2/1982 | Simko | 365/185 |
| 4,328,565 | 5/1982 | Harari | 365/185 |
| 4,442,447 | 4/1984 | Ipri et al. | 357/23.5 |
| 4,486,769 | 12/1984 | Simko | 357/23.5 |
| 4,513,397 | 4/1985 | Ipri et al. | 357/23.5 |

FOREIGN PATENT DOCUMENTS 0045578 2/1982 European Pat. Off. ........... 357/23.5

OTHER PUBLICATIONS

Hsieh et al., IBM Technical Disclosure Bulletin, vol. 23, No. 2, 7/80.
"16-K EE-PROM Relies on Tunneling for Byte-Erasable Program Storage", W. S. Johnson, et al., Electronics, Feb. 28, 1980, pp. 113-117.

Primary Examiner—Andrew J. James
Assistant Examiner—Mark Prenty
Attorney, Agent, or Firm—Birgit E. Morris; William J. Burke; Henry Steckler

[57] ABSTRACT

An electrically alterable, nonvolatile floating gate memory device is described wherein the word line and the floating gate are arranged in a parallel relationship with the word line positioned above the floating gate and coincident therewith. A program line is oriented perpendicularly to both the floating gate and the word line in order to minimize the floating gate-program line capacitance and maximize the floating gate-word line capacitance. The net result of using such an arrangement is to reduce the disturbance of the non-selected cells during the write cycle and also to achieve a significant higher packing density.

8 Claims, 13 Drawing Figures

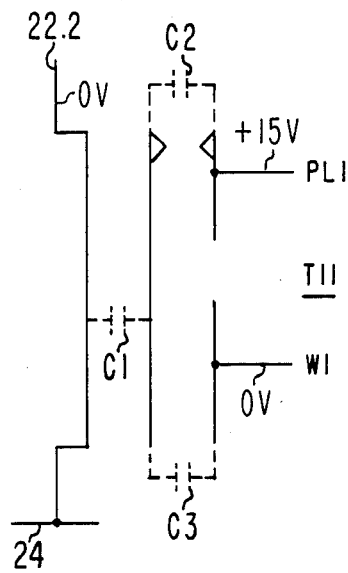
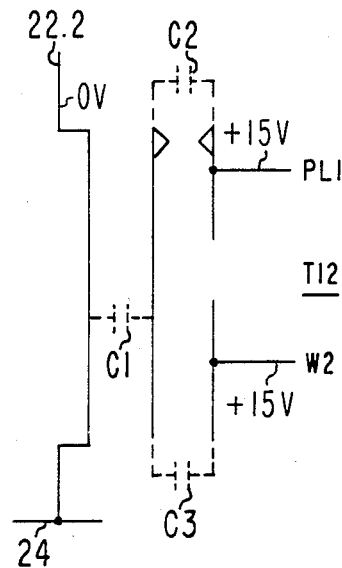
Fig. 5A Fig. 5B
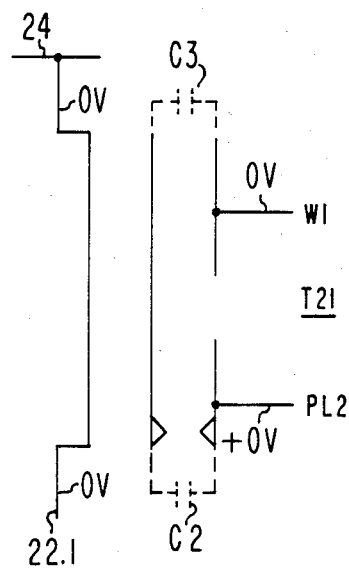
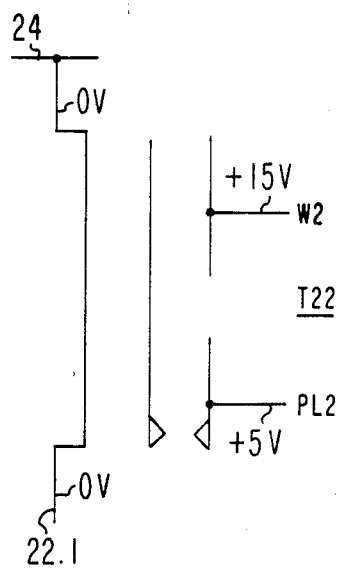
Fig. 5C Fig. 5D ent source of operating potential to maintain stored information. Further, since the devices are nonvolatile, there is neither a requirement nor a need to continuely refresh the devices and thus, there is a significant savings in power.

ELECTRICALLY ALTERABLE PROGRAMMABLE NONVOLATILE FLOATING GATE MEMORY DEVICE

BACKGROUND OF THE INVENTION

This invention relates, in general, to semiconductor devices and, more particularly, to electrically alterable, nonvolatile floating gate memory devices.

Floating gate devices, are becoming more widely used since by its nature it is nonvolatile and thus, is independent of any outside source of operating potential to maintain stored information. Further, since the devices are nonvolatile, there is neither a requirement nor a need to continuely refresh the devices and thus, there is a significant savings in power.

In a co-pending Application for Letters Patent Ser. No. 467,643 filed on 18 February 1983, entitled "DUAL WORD LINE, ELECTRICALLY ALTERABLE, NONVOLATILE FLOATING GATE MEMORY DEVICE" and now U.S. Pat. No. 4,577,215 and assigned to the same assignee as the subject application we described a novel cell wherein the capacitance $C_1$ is formed by the interaction of the floating gate and substrate, capacitance $C_2$ is formed by the interaction of the program line and the floating gate and, $C_3$ is formed between the word line and the floating gate. The major thrust of our prior application was to form a nonvolatile floating gate memory device wherein the word-line-to-floating-gate capacitance is significantly greater than either the program-line-to-floating gate capacitance or the floating-gate-to-substrate capacitance. Both the program line and the word line were made to be coincident, that is they were parallel to each other and the word line was positioned above the program line. The high efficiencies were achieved by the use of the hour-glass capacitance of the floating gate and by making the program line significantly narrower than the word line. In fact, the various capacitances were proportioned to achieve the relationship:

$$C_2 < C_3 > C_1 \qquad (1)$$

and that, by way of example, $$C_3 = 3C_2 = 3C_1 \qquad (2)$$

In which event, the various efficiencies would be:

$$\text{Write Efficiency} = \frac{C_2 + C_3}{C_1 + C_2 + C_3} = 80\% \qquad (3)$$

and:

$$\text{Read Efficiency} = \frac{C_1 + C_2}{C_1 + C_2 + C_3} = 80\% \qquad (4)$$

In our cell, the word-line-to-floating-gate capacitance is made significantly greater than either the program-line-to-floating-gate capacitance or floating-gate-to-substrate capacitance thus minimizing coupling to the floating gate during a write or erase cycle in order to maximize the coupling during a read cycle.

While the device of our prior application is entirely satisfactory it is, however, felt that by rearranging the structure the device would better lend itself to more efficiently inhibiting the partial programming or smearing of adjacent cells during a "write" operation. Additionally, higher packing densities can be achieved while sacrificing little, if any, of the read and write efficiencies.

SUMMARY OF THE INVENTION

We have found that if we oriented word line and the floating gate in a parallel relationship with the word line arranged above the floating gate and further, if we arranged the program line perpendicular to both the floating gate and the word line, we are able to minimize the capacitance between the floating gate and the program line and maximize the capacitance between the floating gate and the word line. By using this arrangement disturbance of the non-selected cells is significantly reduced during a write cycle and we are also able to achieve a significantly higher packing density in the same area occupied by a prior art cell.

BRIEF DESCRIPTION OF THE DRAWING

FIGS. 4A–D and 5A–D are schematic representations showing the various voltages during "write" and "erase" operations.

DETAILED DESCRIPTION OF THE INVENTION

Figure 1:
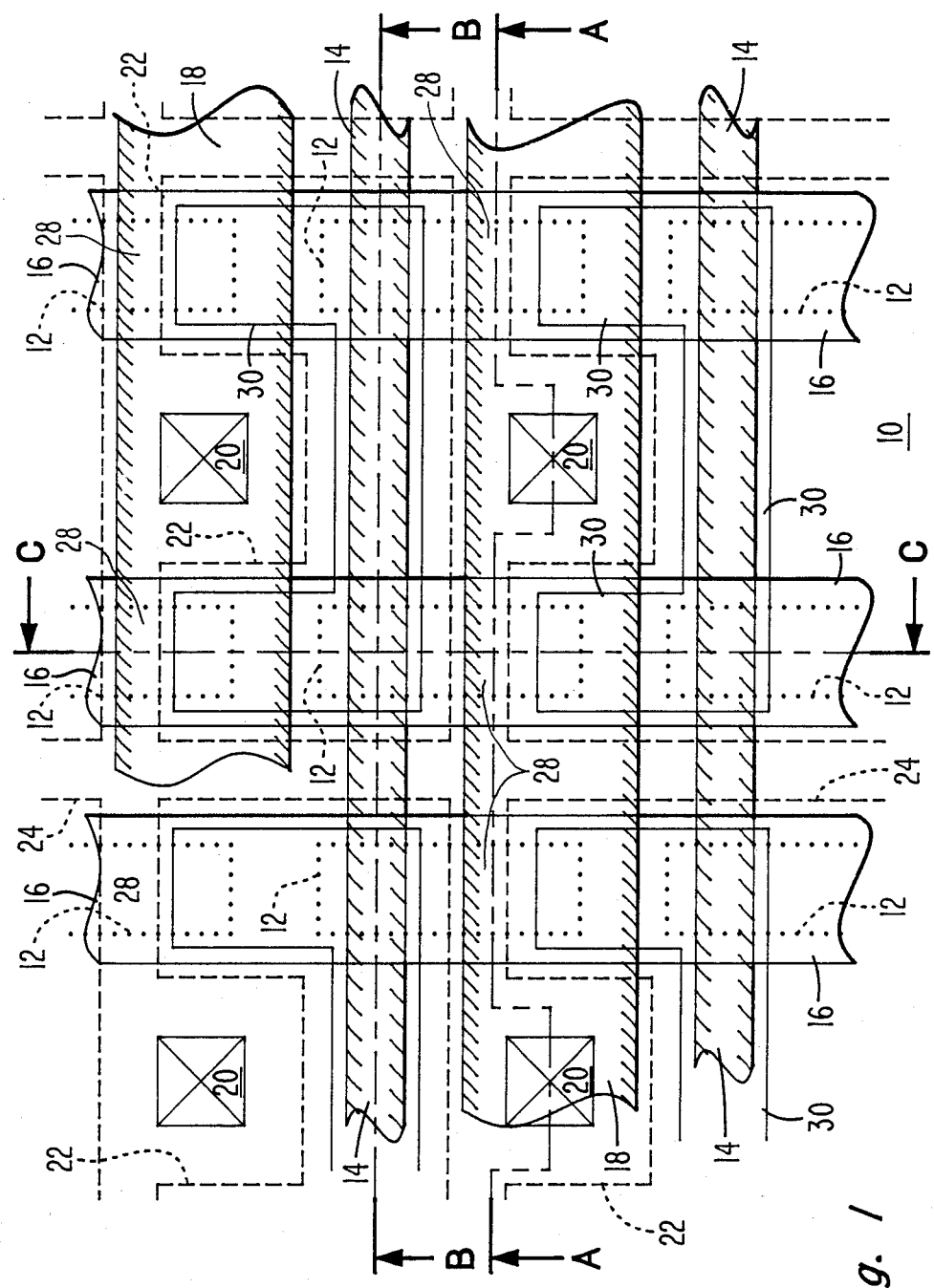
FIG. 1 is a schematic representation of the floating gate memory device made in accordance with the teachings of the subject invention.

Referring to the drawings, it will be seen that, for the sake of clarity the insulating oxide layers between conductive layers 12, 14, 16 and 18, as well as tunnel oxides under floating gates 12 have not been shown with the usual cross-hatching. Further, in order to more clearly show the relationship of floating gates 12 to drain and source regions 22 and 24 respectively, as well as the relationship of floating gates 12 to channel regions 28, a portion of the metal bit lines 18 have been omitted in the lower left portion of FIG. 1.

Referring now to FIGS. 1, 2A, 2B and 2C, it will be seen that substrate 10 has been provided with source lines 24 and drain regions 22 that are oppositely doped with respect to the substrate. Since the substrate 10 initially has P-type conductivity modifiers, source line 24 and drain region 22 will be appropriately doped with N-type conductivity modifiers as is well known in the art.

Figure 2A:
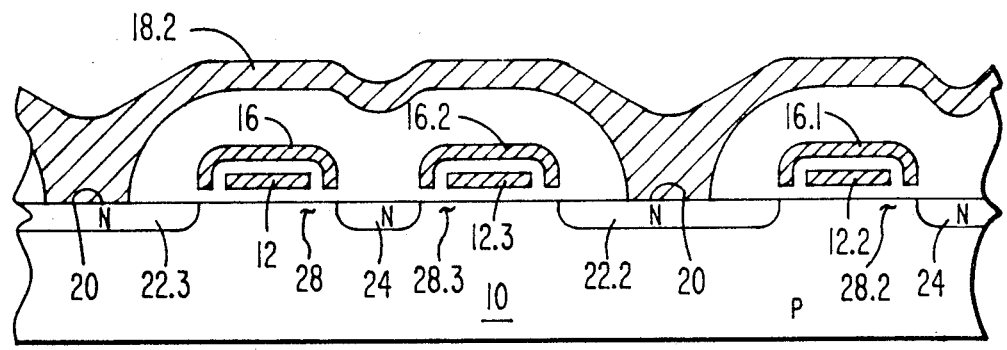
FIG. 2A is a cross-sectional, elevation view of the device of FIG. 1 taken along A—A of FIG. 1.
Figure 2B:
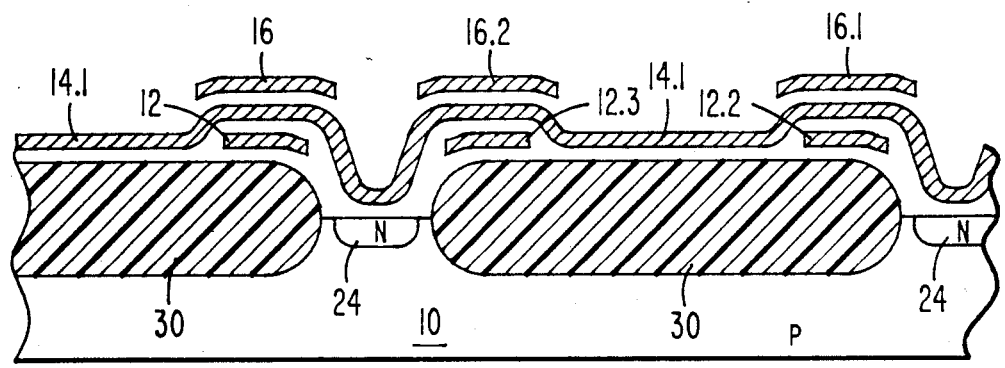
FIG. 2B is a cross-sectional, elevation view of the device of FIG. 1 taken along line B—B of FIG. 1.
Figure 2C:
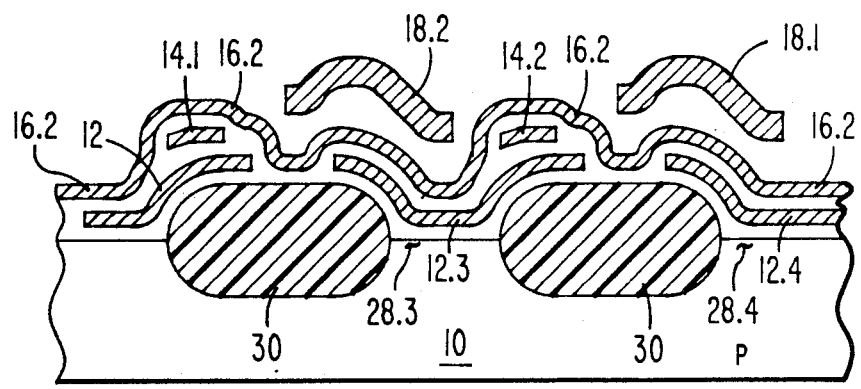
FIG. 2C is a cross-sectional elevation view of the device of FIG. 1 taken along line C—C of FIG. 1.

Each metal bit line 18 in a given column contacts each drain region 22 in that column by means of contact 20 in order to apply the same voltage to each of the drain regions in the given column. As described in our previously mentioned co-pending application, the subject application is also provided with parallel doped coincident polycrystalline silicon (polysilicon) lines 12 and 16 representing the floating gate and word line respectively. It should be noted that word line 16.1 and floating gates 12.1 and 12.2 are coincident as are word line 16.2 and floating gates 12.4 and 12.3. That is, the word line and floating gates are oriented in a direction parallel to each other with the word lines positioned above the floating gates. However, as distinguished from our co-pending application, program lines 14.1 and 14.2 are displaced from and are intermediate the word lines and floating gates and extend in a direction perpendicular to both the floating gates (12.1, 12.2, 12.3 and 12.4) and word lines (16.1 and 16.2). In addition, as shown more clearly in FIG. 1, program lines 14.1 and 14.2 are displaced from the active regions as represented by drain regions 22 and channel region 28 and only minimally crosses source line 24. Additionally, while program lines 14.1 and 14.2 are shown in FIGS. 2B and 2C as the second deposited polysilicon level we do not wish to be so limited. Those skilled in the art will recognize that the position of floating gates (12, 12.1, 12.2, etc.) shown (in FIGS. 2B and 2C) as a first polysilicon level may be interchanged with program line 14.1 and 14.2. That is, as an alternative, the program lines would be shown as the first level polysilicon layer in which event the floating gate would be the second polysilicon level.

Figure 3:
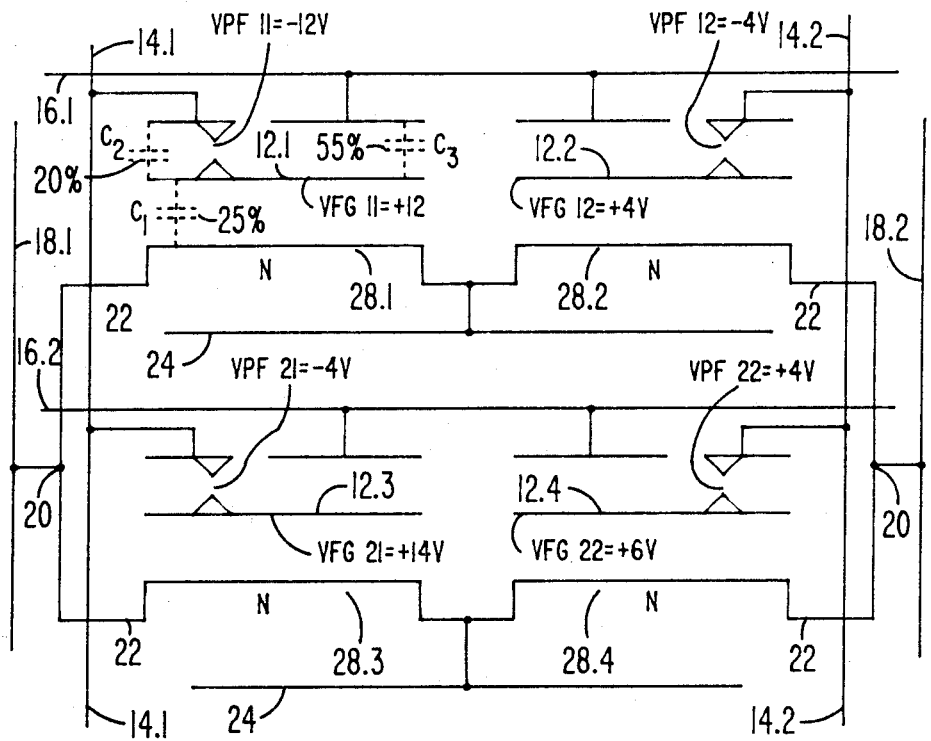
FIG. 3 is a schematic representation of an array of adjacent cells of FIG. 1 arranged in rows and columns.
Figure 4A:
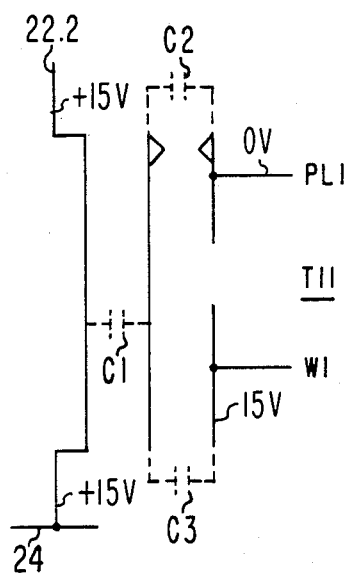
Figure 4B:
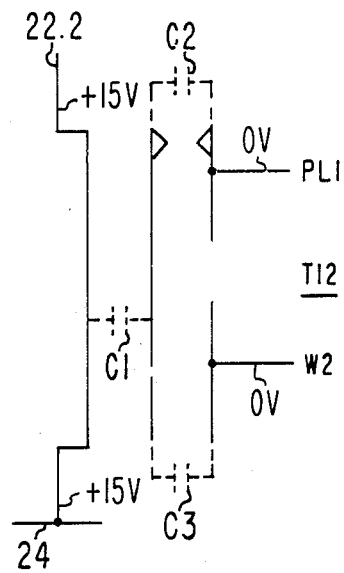
Figure 4C:
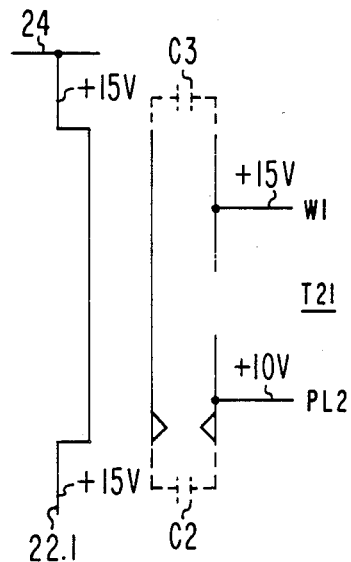
Figure 4D:
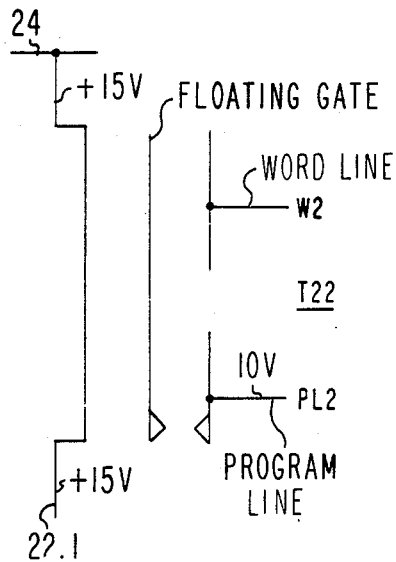

Referring now to FIG. 3, there is shown a schematic representation of our novel device which, when taken in conjunction with the following table may be used in any array of similar devices as shown. To facilitate the explanation of the "write", "erase" and "read" functions, a group of four cells are presented and numbered 1, 2, 3 and 4 respectively, with cell 1 representing the selected cell and cells 2–4 representing the deselected cells. As a further explanation, it should be understood that the cells have all been initially "erased". That is, they are in a low threshold, high conduction state. Alternatively the cells may be "written" to a high threshold, low conduction state.

TABLE

|  | Source Line (24) | Drain Line (22) | Program Line (14) | Word Line (16) |
| --- | --- | --- | --- | --- |
| WRITE (T11) | 15v | 15v | 0v | 15v |
| WRITE (T12) | 15 | 15 | 10 | 15 |
| WRITE (T22) | 15 | 15 | 0 | 0 |
| WRITE (T21) | 15 | 15 | 10 | 0 |
| ERASE (T11) | 0 | 0 | 15 | 0 |
| ERASE (T12) | 0 | 0 | 5 | 0 |
| ERASE (T22) | 0 | 0 | 15 | 15 |
| ERASE (T21) | 0 | 0 | 5 | 15 |
| READ | 0 | 2.5 | 0 | 5 |

As will be seen in FIG. 3, lines 24 and 22 represent the source and drain lines respectively. Lines 18 represent the metal bit line connected to drain region 22. Program lines 14 are shown associated with each cell so as to form a capacitance C2 with the floating gate 12 which capacitance has been tailored by choosing the appropriate oxide thickness and overlap over program line 14 of floating gate 12 to produce about 20 percent of the total capacitance. Similarly, word line 16 has been tailored so that with the appropriate oxide thickness and area of overlap with respect to floating gate 12, a capacitance C3 is produced which is about 55 percent of the total cell capacitance. Floating gate 12 has been similarly tailored to produce a capacitance C1, with respect to the substrate that represents about 25 percent of the total capacitance of the cell. By using a capacitance distribution ratio of C1:C2:C3 as described, our novel cell will produce a minimum of program smearing in the deselected cells of the type described.

Before discussing the operation of the memory array in detail it should be appreciated that a voltage differential ($V_{PF}$) between the program line, functioning as a programming gate and the floating gate causes a tunneling current to flow between these two gates. The tunneling current may be bidirectional being a function of the polarity of $V_{PF}$. That is, if the floating gate potential is more positive than the program line, conventional current flow from the floating gate to the program line discharges the floating gate. On the other hand, if the program line potential is more positive than the floating gate potential, conventional current flows from the program line to the floating gate charging the latter. It should also be noted that decreasing the $V_{PF}$ by a factor of two ($\frac{1}{2}$) decreases the tunneling current by approximately a factor of $10^8$. Moreover, decreasing the $V_{PF}$ by a factor of three ($\frac{1}{3}$) decreased the tunneling current by a factor of $10^{12}$.

A significant aspect of the invention is that during a write cycle, the deselected devices of the array are subjected to a $V_{PF}$ which is approximately $\frac{1}{3}$ the $V_{PF}$ of selected devices. This ensures that the non-selected devices undergo little disturbance or "smearing" when selected devices are being set to a desired state. This aspect of the invention is in contrast to prior art memory arrays in which the non-selected cells are subjected to a ($V_{PF}$) which is approximately $\frac{1}{2}$ the programing voltage ($V_{PF}$) of the selected devices.

Another significant aspect of the invention, as detailed below, is that all the non-selected devices have approximately the same amplitude of $V_{PF}$ induced between the programming and floating gates. Still another significant aspect of the invention, also detailed below, is that a non-selected device neither sharing a row nor a column with a selected device herein, also identified as a "doubly" deselected device is exposed to a $V_{PF}$ of opposite polarity to the $V_{PF}$ of the deselected devices sharing a row or a column (single deselected rows) with a selected device.

The operation of the memory array is best understood with reference to FIGS. 4 and 5.

It will be shown that a selected memory cell may be written to either the high threshold ($V_{TH}$) condition or to the low threshold ($V_{TL}$) condition while non-selected memory cells will not be disturbed because they will be subjected to potential stresses significantly below the voltage stress necessary to write. Assume, for example, that all the devices of the array (e.g. T11, T12, T21, and T22) are initially in its virgin, unwritten state ($V_0=0$). Assume further that T11 is to be set (written) to the $V_{TH}$ condition while the remaining memory devices (T12, T21 and T22) are undisturbed. In the discussion to follow, the voltage (VFG) induced on the floating gate of each device is a function of the voltages applied to the programming line (VPL1), the word line (W1) and the drains and sources (lines 22 and 24) may be expressed and caluculated from the following equation:

$$VFG = V_o + \frac{C_3}{C_T} \Delta V_W + \frac{C_1}{C_T} \Delta VSD + \frac{C_2}{C_T} \Delta V_{PL} \quad (5)$$

where:
C1 = Capacitance between floating gate 12.1 and substrate
C2 = Capacitance between program line (PL1) and floating gate 12
C3 = Capacitance between word line (W1) and floating gate 12
$C_T$ = Total capacitance (C1+C2+C3)
$\Delta VW$ = potential difference (with respect to ground) applied to word line and control gate ΔVSD = potential difference (with respect to ground) applied to source and drain regions ΔVPL = potential difference (with respect to ground) applied to program line; and Vo = voltage intially on floating gate with all other floating gates at ground.

To write $T_{11}$ (i.e. the selected device) to the $V_{TH}$ state its word line (W1), corresponding to word line 16 is driven to +15 volts, its programming line (PL1) PL1, corresponding to program line 14 is driven to 0 volts, while its source and drain (24 and 22) are driven to +15 volts. The programming lines (e.g. PL2) of the deselected rows are driven to +10 volts and the word lines (e.g. W2) of the deselected columns are driven to 0 volts.

For these values of applied voltages, the voltages induced on the floating gates of T11, T12, T21 and T22, respectively, is approximately as follows as calculated from EQ(1) above:

FG11 = 12 volts
FG12 = 4 volts
FG21 = 14 volts
FG22 = 6 volts

Recall that the critical parameter in writing a device (e.g. T11) is the potential differential $VPF_{ij}$ between its programming line (e.g. PL1) and its floating gate (e.g. FG11).

The potential differentials (VPFij) between the programming lines and the floating gates of T11, T12, T21, and T22 is, approximately as follows:

VPF11 = −12 volts
VPF12 = −4 volts
VPF21 = −4 volts
VPF22 = +4 volts

Recall also that it is only when the stress between the program line and the floating gate exceeds a given level (e.g. 8-9 volts) that significant conduction (i.e. tunneling of charge) takes place between the program line (PL1) and the floating gate. In the case of T11 when the floating gate is driven to 12 volts more positive than the program line (PL1), the floating gate capacitance discharges into the program line. For purposes of this discussion assume that the voltage (VFG11) on the floating gate of T11 decreases from 12 volts to 11 volts. The 1 volt drop corresponds to the amount of charge that will leak off the floating gate during the time the writing voltages are applied to T11.

A significant aspect of this invention is that the deselected devices T12, T21 and T22 see only 4 volts (approximately) across their tunnel oxide (i.e. program line PL1 to floating gate). The stress voltage (VPFji) of the deselected cells is thus approximately one third (⅓) the value of the stress voltage applied to the selected device T11. Note also that the deselected cells (T12, T21) sharing a row or a column with a selected cell (T11), have a VPF of one polarity (i.e. −4 volts) while the deselected cell (T22) not sharing a row or a column with the selected cell has a VPF of opposite polarity (i.e. +4 volts). The amplitude of the stress voltage (VPF), applied to all deselected devices, is approximately equal. This stress is substantially less than ½ of that applied to the selected device. Furthermore, the polarity of the stress voltage applied to "double" deselected devices is of opposite polarity to the stress voltage applied to "singly" deselected devices "Stingly" deselected devices are defined as those non-selected devices that share either a row or column with a selected device while "doubly" deselected devices are defined as those non-selected devices that share neither a row nor a column with a selected device.

With the return of the writing voltages to ground, the floating gates of the deselected devices return to their initial condition since they have not been disturbed during the write cycle. For purposes of this discussion we assumed the initial VFGij of the deselected devices return to 0 volts.

Recall that FG11 was assumed to have decreased from +12 to +11 volts during the write operation. Consequently, when VPL1, VW1 and the source/drain voltages are returned to 0 volts, the floating gate voltage will be returned to approximately −1 volt.

The (−1) volt stored on the floating gate increases the threshold voltage of the cell and the cell is therefore set to $V_{TH}$.

A memory cell is read by applying 5 volts to its word line, 0 volt to its programming line, 0 volt to terminal 24 and precharging its drain (e.g. line 22) to 2.5 volts. Note that the drain line functions as the 1st line during the read cycle.

If the cell is set to VTH due to its floating gate being at or more negative than −1 volt, there is no conduction in its source-drain path and the bit line rises toward +5 volts. If the cell is set to VTL due to its floating gate being at or close to +1 volt, there is conduction in its source-drain path and the bit line is discharged to ground potential.

What we claim is:

1. In an electrically alterable, nonvolatile floating gate memory device having a body of semiconductor material of a first conductivity type, a source region and a drain region of a second opposite conductivity type embedded in the body of semiconductor material and spaced one from the other to define a channel region, a conductive floating gate member insulated from the body of semiconductor material and having a portion thereof disposed over the channel region, a conductive word line, a conductive bit line and a conductive program line, the improvement which comprises:

the floating gate member and the word line being positioned over the semiconductor body with the floating gate member and the word line insulated from each other and substantially coincident with each other in one direction;

the bit line having a portion thereof in ohmic contact with the drain region and arranged to extend in a direction orthogonal with respect to the direction of the floating gate member and word line insulated therefrom; and the program line being one in number and having a bidirectional conduction characteristic with respect to the floating gate member and arranged parallel to the bit line and extending in a direction orthogonal with respect to the direction of the floating gate memory and the word line.

2. The memory device of claim 1, wherein:

the floating gate member is a first level doped polycrystalline silicon layer;

the program line is a second level, doped polycrystalline silicon layer; and the word line is a third level, doped polycrystalline silicon layer.

3. The memory device of claim 1, wherein:

the floating gate member is a first level doped polycrystalline silicon layer;

the word line is a second level doped polycrystalline silicon layer; and the program line is a third level doped polycrystalline silicon layer.

4. The memory device of claim 1, further comprising:
a plurality of other, like memory devices, the devices being arranged in rows and columns with a single program line per row;
a plurality of metal bit lines, each bit line connecting all of the drain regions in a given row; and
a doped source line forming a common source regions for adjacent memory devices in adjacent rows.

5. The combination comprising:
an array of memory cells arranged in rows and columns; each cell including a device having: (a) source and drain regions defining the ends of a conduction channel; (b) a floating gate overlying said conduction channel and insulated therefrom; (c) a control gate overlying said floating gate and insulated therefrom; and (d) programming means capacitively coupled to said floating gate via an insulating layer for selectively altering the potential on said floating gate;
a row conductor per row of cells connected to one of the source and drain regions of the cells of a row;
a common terminal connected to the other one of the source and drain regions of the cells of the array;
a word line per column of cells connected to the control gate of the devices of a column; and
a programming line per row of cells connected to the programming means of the devices of a row, said word lines and programming lines being disposed in an orthogonal direction to each other for enabling the potential between the floating gate and the programming means of the non-selected devices of the array to be significantly less than one-half the potential between the floating gate and the programming means of the selected devices of the array.

6. The combination as claimed in claim 5 wherein: the potential developed between the floating gate and the programming means of a non-selected cell not sharing a row or column with a selected cell is of opposite polarity to the potential developed between the floating gate and the programming means of a selected cell and the non-selected cells sharing a row or a column with a selected cell.

7. The combination as claimed in claim 5 wherein the capacitance between said control gate and said floating gate is greater than the capacitance between said programming means and said floating gate and is greater than the capacitance between said conduction channel and said floating gate.

8. The combination comprising:
an array of memory cells arranged in rows and columns, each cell having source and drain regions defining the ends of a conduction channel, a floating gate overlying said conduction channel, a control gate overlying said floating gate, and a programming gate capacitively coupled to said floating gate for selectively altering the potential on said floating gate; wherein
the floating gate to the conduction channel exhibits a first capacitance ($C1$), the floating gate to the programming gate exhibits a second capacitance ($C2$) and the floating gate to the control gate exhibits a third capacitance ($C3$), wherein $C2 < C3 > C1$;
a word line per column of cells connected to all the control gates of the devices of a respective column;
a programming line per row of cells connected to the programming gate of the devices of a row; and
means for selectively applying voltages to the word lines, programming lines and to the source and drain regions for inducing a first stress voltage between the floating gate and the programming line of selected cells and for concurrently inducing a stress voltage which is less than $\frac{1}{2}$ the first stress voltage between the floating gate and the programming line of the remaining cells.

* * * * *